United States Patent
Cao

(10) Patent No.: US 7,305,651 B2
(45) Date of Patent: Dec. 4, 2007

(54) MASK CD CORRECTION BASED ON GLOBAL PATTERN DENSITY

(75) Inventor: Min Cao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 341 days.

(21) Appl. No.: 11/155,159

(22) Filed: Jun. 17, 2005

(65) Prior Publication Data

US 2006/0286690 A1   Dec. 21, 2006

(51) Int. Cl.
*G06F 17/50* (2006.01)
(52) U.S. Cl. .......................................... 716/19; 716/20
(58) Field of Classification Search ................. 716/19, 716/21; 438/14
See application file for complete search history.

(56) References Cited

U.S. PATENT DOCUMENTS

| | | | |
|---|---|---|---|
| 5,740,068 A * | 4/1998 | Liebmann et al. ............. | 716/21 |
| 5,858,591 A | 1/1999 | Lin et al. | |
| 6,194,104 B1 | 2/2001 | Hsu | |
| 6,316,152 B1 | 11/2001 | Hsieh et al. | |
| 6,472,108 B1 | 10/2002 | Lin | |
| 2002/0175298 A1 * | 11/2002 | Moniwa et al. ......... | 250/492.22 |
| 2003/0229412 A1 * | 12/2003 | White et al. ................ | 700/121 |
| 2004/0058255 A1 * | 3/2004 | Jessen et al. ................. | 430/30 |
| 2004/0060033 A1 * | 3/2004 | Kamon ........................ | 716/19 |

* cited by examiner

*Primary Examiner*—Sun James Lin
(74) *Attorney, Agent, or Firm*—Haynes and Boone, LLP

(57) ABSTRACT

The present disclosure provides a method of forming a photomask layout. In one example, the method comprises selecting a pattern feature on the photomask layout, defining a global area centered at the pattern feature on the photomask layout, calculating a pattern density inside the global area, and correcting the pattern feature based on the pattern density and patterning process data.

20 Claims, 3 Drawing Sheets

MASK CD CORRECTION BASED ON GLOBAL PATTERN DENSITY

BACKGROUND

In semiconductor technologies, a material layer is etched to from a plurality of pattern features by a lithography process. Dimensional and geometrical variations of the pattern features can be introduced during an etching process. For example, a global etching loading effect during an etching process to form a pattern in a semiconductor wafer may result in critical dimension (CD) variation associated with a global etching pattern density.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
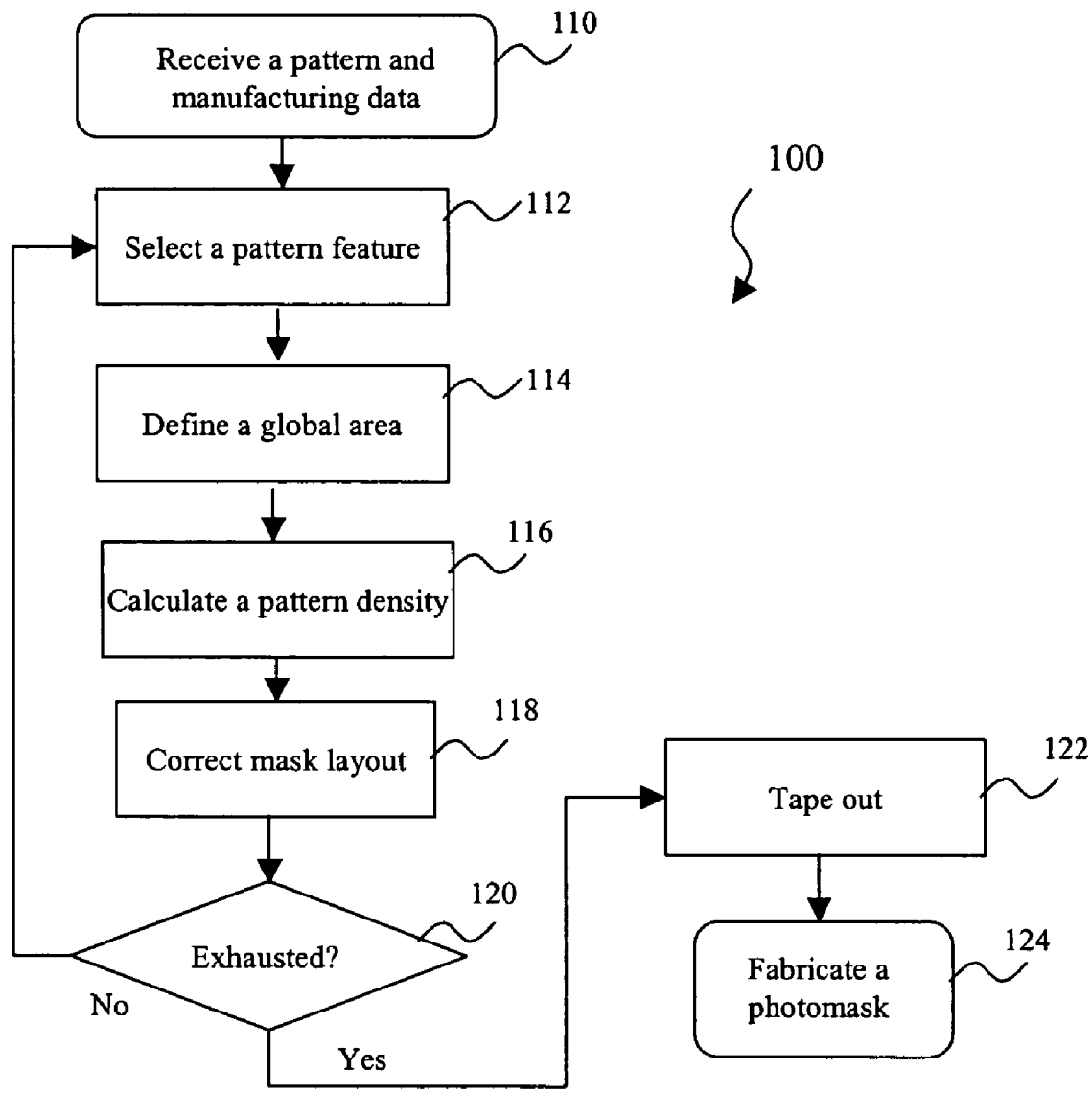
FIG. 1 is a flowchart of one embodiment of a method to design a photomask.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 2A:
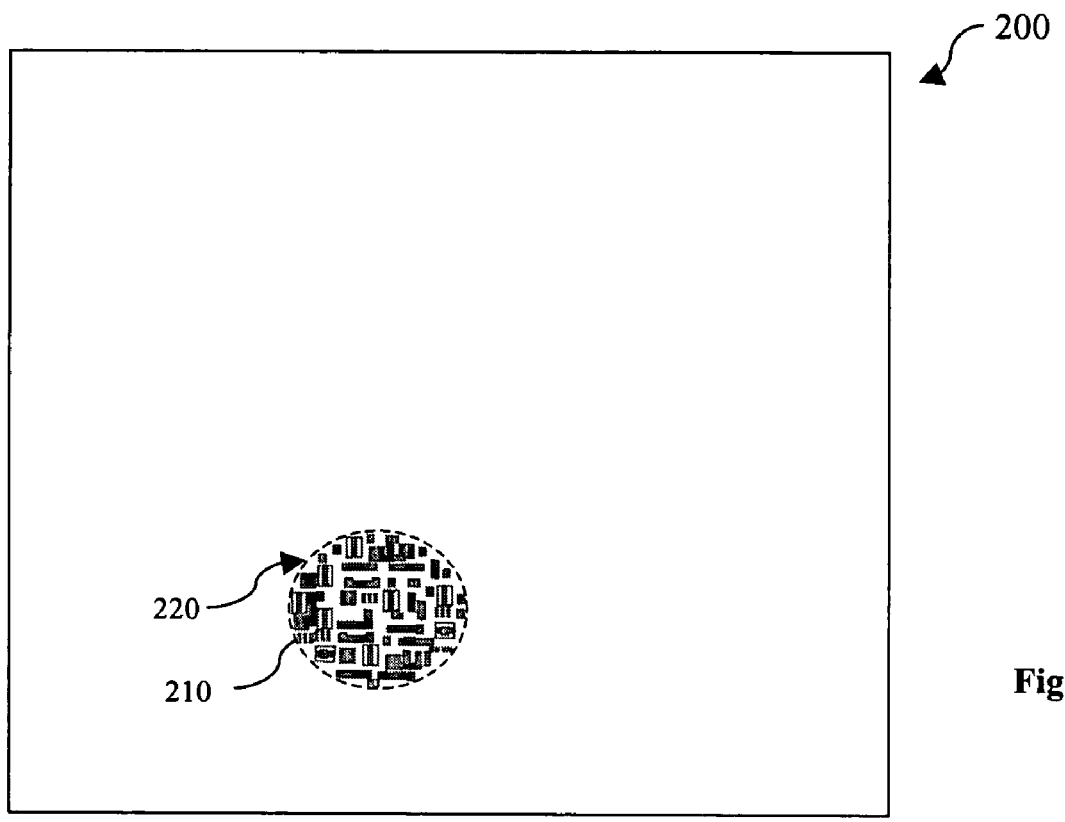
FIGS. 2a and 2b are top views of a photomask according to aspects of the present disclosure in one embodiment.

FIG. 1 is a flowchart of one embodiment of a method 100 to form a photomask pattern which compensates a global pattern loading effect of an etching process to form the mask pattern on a photomask (mask, or reticle, collectively referred to as mask). The mask pattern comprises geometries of an integrated circuit pattern to be written or projected on a mask and is also referred to as the mask layout or mask pattern layout. The method 100 is described below with additional reference to FIGS. 2a and 2c as top views of an embodiment of a mask constructed according to aspects of the present disclosure.

The method 100 may begin at step 110 by receiving an expected pattern and manufacturing data associated with an etching process to form a mask pattern 210 on a mask 200. The mask 200 may comprise a transparent substrate with a absorption layer coated thereon, for example. The transparent substrate may use fused silica ($SiO_2$), calcium fluoride ($CaF_2$), and/or other suitable materials. The absorption layer may comprise chromium (Cr), MoSi, and/or other suitable materials. For example, the mask may be a fused quartz substrate with a chromium coating layer. The mask may further comprise a plurality of anti-reflective coating (ARC) layers disposed between various interfaces such as an interface between the transparent substrate and the absorption layer. The mask may be further coated with a photoresist (resist) layer for mask patterning and is referred to as a mask blank.

Initially, the mask layout may be the expected pattern or is converted therefrom. For example, an initial mask layout may incorporate a plurality of assist features to the expected pattern to compensate for optical proximity error using an optical proximity correction (OPC) technology. In another embodiment, OPC or other mask technologies including phase shift mask (PSM) may be incorporated into the mask layout before or after the CD correction to compensate for the global pattern loading effect according to the present disclosure.

A method to pattern the mask may include resist patterning and etching processes. After a coated resist layer is patterned using a method such as electron-beam writing (EB writing) according to the mask layout, an etching process may be implemented to partially remove the absorption layer to transfer the resist pattern to the absorption layer and/or the transparent substrate (such as in a phase-shift mask). However, during the etching process, etching rate and etching behavior may depend on a global etching pattern density, referred to as the global etching loading effect. The global etching loading effect results in pattern dimension variation (or CD variation). For example, if a pattern feature at 30% pattern density targets 100 nm width after the etching process, then the same pattern at 20% pattern density may achieve 95 nm width and the same pattern at 40% pattern density may achieve 105 nm width. In an exemplary 130 nm technology, a mask pattern for poly-silicon gate layer may have large density variation ranging from about 50% to about 90%. The CD variation with different pattern density may be about 15 nm to 20 nm. The gate length may require more precise dimension and such dimension variation during a poly-silicon layer patterning may fail the mask or cause reliability/quality issues to semiconductor wafers fabricated using the mask. The CD variation relative to the ideal CD may be referred to as the global etching bias (or global bias). Generally, in addition to the global etching loading effect, a global pattern loading effect may also include other global effects such as fogging effect during EB writing. Although most examples in the disclosure are about the etching process, other processes such as EB writing and associated global effect may also be included and considered in the method 100 without departure of the spirit of the present disclosure. For simplicity, the etching process is described and illustrated here.

The manufacturing data (or patterning process data) may include data of the etching process such as etching recipes. The etching process may be a dry etching process or other suitable etching including wet etching. The etching process may be either purely chemical (plasma etching), purely physical (ion milling), or combinations thereof (reactive ion etching). The etching recipe may include etchant, etching time, gas flow rate, and other etching parameters. The manufacturing data may include composition and etching behavior of the absorption layer (and other layers such as ARC layer). The manufacturing data may include information of the processing tool to implement the etching process. For example, a plasma etching tool may have ion species and geometrical factors. The manufacturing data may also include mask type and technology nodes such as 65 nm and 90 nm technology nodes. The global etching loading bias may substantially depend on the manufacturing data. A relationship between the global etching loading bias and the pattern density may be collected from the mask manufacturing and saved in a database with the manufacturing data.

The relationship therebetween may be further correlated with the manufacturing data and saved.

Figure 2B:
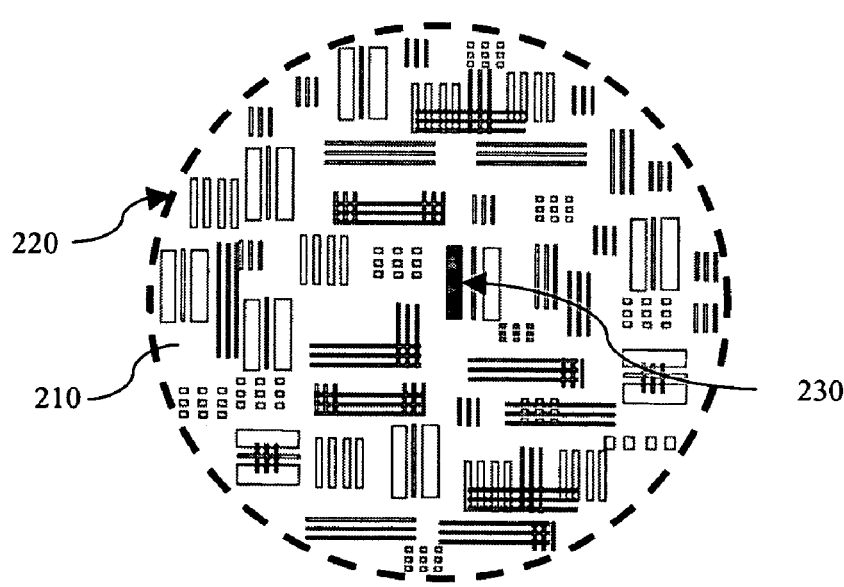

The method 100 may proceed to step 112 to select a pattern feature from the mask layout. One pattern feature may be selected for CD correction. For example, a pattern feature 230 of FIG. 2 is selected for CD correction. Then the method may return back to select another pattern feature for CD correction until all pattern features in the mask are corrected. The selected pattern feature is not limited to include only one pattern feature. For efficiency, the selected pattern feature may include a plurality of pattern features disposed in a small area. For example, the selected pattern feature may comprise a number of conductive lines. In one embodiment, the plurality of selected pattern features may be defined within a circular area having a radius about several microns, for example, and may be grouped together as the selected pattern feature. Thus, by selecting more than one feature each time, the method 100 may take less iteration time to correct all pattern features in the mask layout.

The method 100 may proceed to step 114 to define a global area on the mask layout. Defining the global area may include selecting a pattern feature from the mask layout and then define the global area centered at the selected pattern feature. Step 114 may include finding a correlation length (or an interaction length) associated with the global etching loading effect. Due to the global etching loading effect, the selected pattern feature on the mask may be impacted by other surrounding pattern features during the etching process and cause the global etching bias. The impact from a surrounding feature becomes weaker when the distance from the surrounding feature to the selected feature increases. Beyond a certain distance, referred to as the correlation length, the impact may drop drastically and can be neglected. A proper global area may substantially include surrounding pattern features within the correlation length and may substantially exclude surrounding pattern features beyond the correlation length. If a global area is defined too small, the global etching loading effect may not be fully considered. If a global area is defined too large, the global etching loading bias at different locations may be averaged instead of fine-tuned. The correlation length may depend on the manufacturing data such as pattern feature size, etching process, and composition of the absorption layer. An exemplary correlation length may range from about 10 micron to about 500 micron. A distance from the selected pattern feature to another pattern feature inside the global area may be less than about 10 micron, for instance. The global area may be defined to have a suitable shape such as a circle, a square, or a rectangle, for example. As an example illustrated in FIGS. 2a and 2b, a mask 200 may have a mask layout comprising a plurality of features (only features inside a circular area 220 is shown). A pattern feature 230 is selected for CD correction. A global area 210 may be defined as circular area 220 substantially centered at the selected pattern feature 210 with a radius of about the correlation length.

The method 100 may proceed to step 116 to calculate a pattern density within the defined global area such as 210. The pattern density within the global area may be a simple average pattern density within the global area. For example, the pattern density may be a ratio between the sum of areas of all pattern features in the global area and the area of the global area. Since each pattern feature inside the global area may have a different contribution to the global etching loading bias, the pattern density may be determined by a weighted averaging method such as a ratio between the weighted sum of areas in the global area and the area of the global area. The weight factor may range from 1 at the center to 0 at the perimeter and depend on the distance to the center of the global area.

The method 100 may proceed to step 118 to correct the selected pattern feature in the mask layout based on the pattern density calculated at step 116. Step 118 may extract a global etching loading bias (global bias) and the associated global pattern density around the selected pattern feature based on the manufacturing data and then modify the selected pattern feature by the global bias. For example, a line feature may be narrowed and/or shortened by the global bias. In another example, A square may be shrunken in both dimensions by the global bias.

As mentioned above, the global bias depends on not only the global pattern density but also the manufacturing data. The implementation of the method 100 may utilize databases, software, hardware, and an integration thereof. For example, a virtual fab comprising various components including a manufacturing execution system (MIS), manufacturing databases, mask fabrication tools, metrology tools, mask design tool, and a network to connect the above components may provide a platform to collect the manufacturing data and implement the mask layout CD correction. In another example, if a global bias corresponding to a given global pattern density can not be found in the database, then an extrapolation method may be used to find out a proper global bias corresponding to the given global pattern density, implemented by a system comprising the software and databases.

The method 100 may proceed to step 120 to check if all pattern features in the mask layout have been corrected by the step 112, 114, 116, and 118. If not, the method 100 may return to step 112, select another pattern feature, and repeat the process from step 112 to step 118 until all pattern features in the mask layout have been corrected with compensation for the global etching loading bias. Again, the selection of another pattern feature may actually select more than one pattern features for efficiency.

The method 100 may proceed to step 122 to form a tape-out for mask workshop. The tape-out comprises the final mask layout information in a format recognizable by mask fabrication tools in the mask workshop. Step 122 may include incorporating other mask technologies into mask layout before forming the final mask layout. For example, assistant features of the OPC may be alternatively added into the mask layout at this step, at step 110, or before the method 100.

The mask 200 may be fabricated at step 124 using normal mask fabrication technologies. An exemplary process may include resist coating, EB writing, etching, and stripping. The EB writing may be substituted by other proper process such as EB projection or ion beam writing. During the etching process, the global etching loading bias could impact patterned features formed in the mask. Since each pattern feature is corrected by the method 100, the correction and the global bias to each pattern feature can be substantially cancelled. Thus, the CD variation due to the global etching loading effect is substantially reduced and the CD uniformity can be greatly improved. Again, other global pattern loading effect during the fabrication such as the fogging effect in the EB writing may be alternatively or collectively considered and compensated to improve the CD uniformity. The pattern features at after-development inspection (ADI), after-etching inspection (AEI), and/or after-stripping inspection (ASI) can be more consistent with reduced variation.

Figure 3:
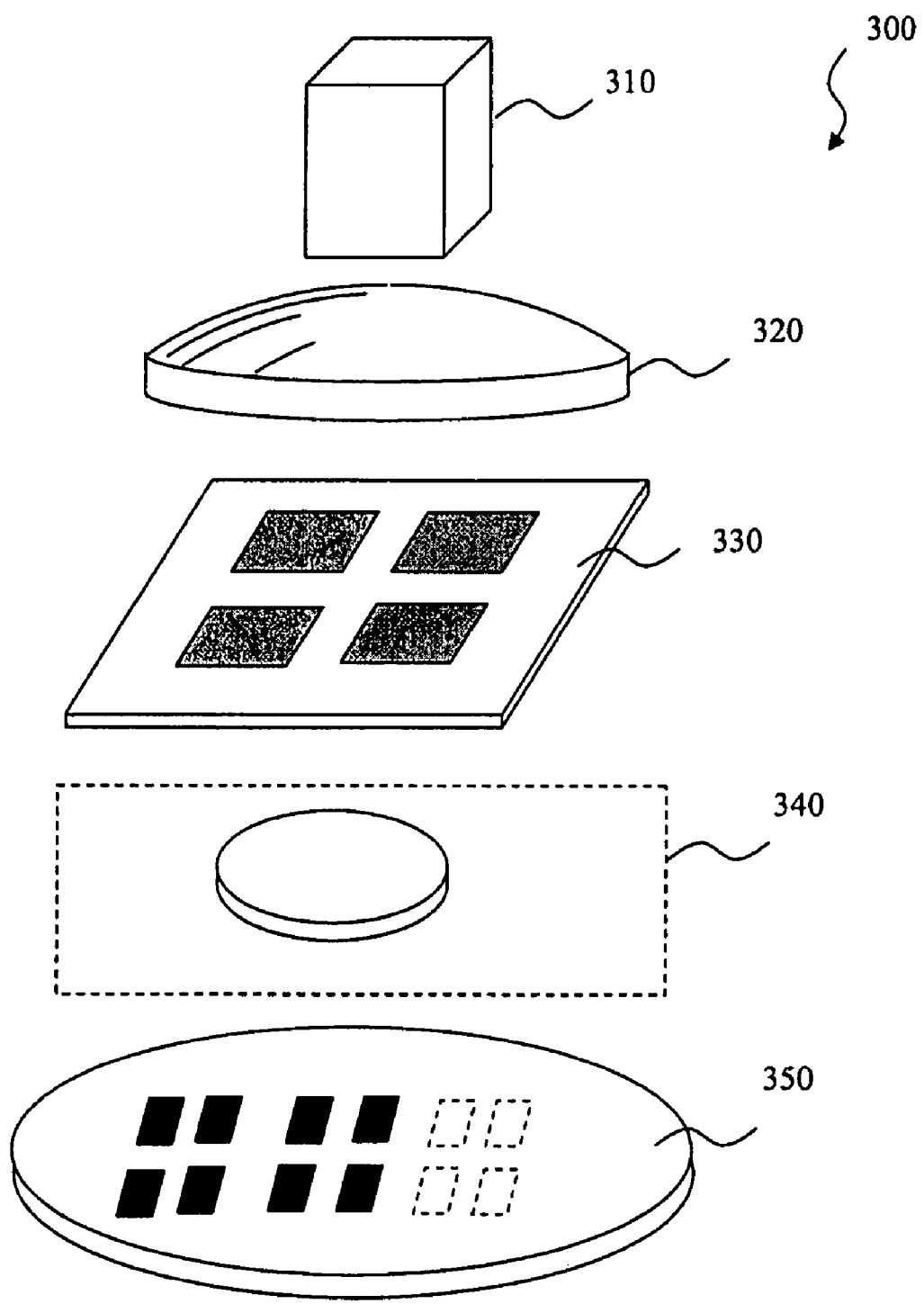
FIG. 3 is a schematic view of an exemplary lithography system.

A mask having a mask layout corrected by the method 100 can be used to pattern a semiconductor wafer using a photolithography process. An exemplary photolithography process may include resist patterning, etching (referred to as a second etching relative to the etching to fabricate a mask for clarification), and resist stripping. The resist patterning may further include processing steps of resist coating, soft baking, mask aligning, exposing, post-exposure baking, developing resist, and hard baking. The exposing process may be utilized by a photolithography system such as an exemplary lithography system 300, a mask 330, and a substrate 350 (wafer), schematically illustrated in FIG. 3. The lithography system 300 may further include a light source 310, an illumination system (e.g., the condenser) 320, and an objective lens 340. The photolithography patterning may also be implemented or replaced by other proper methods such as maskless photolithography, EB writing, and ion-beam writing. During the second etching process, a second global etching loading bias may also impact the critical dimension of the semiconductor wafer and can be alternatively compensated using the mask or mask layout corrected by the method 100 wherein the correction includes a second global etching loading bias from the second etching process. Thus in patterning a semiconductor wafer, the CD variation due to the second global etching loading effect can be reduced and the CD uniformity in the semiconductor wafer may also be substantially improved. In this example, the etching process and the relevant manufacturing data may be those related to the etching process to pattern a semiconductor wafer. In another example, the manufacturing data may include both the first etching process to form a mask and the second etching process to form a semiconductor wafer. The present disclosure may not be limited to reduce the global etching loading effect during an etching process to form a mask and can be used to reduce the global etching loading effect during an etching process to from a semiconductor wafer or other substrate such as a transparent glass plate used in thin film transistor liquid crystal displays (TFT-LCD).

Thus the present disclosure provides a method 100 of forming a photomask layout. The method comprises selecting a pattern feature on the photomask layout, defining a global area centered at the pattern feature on the photomask layout, calculating a pattern density inside the global area, and correcting the pattern feature based on the pattern density and patterning process data.

In the method 100, the substrate may be selected from the group consisting of a photomask, a semiconductor wafer, and a transparent glass plate. The expected pattern may comprise a pattern of integrated circuit to be formed in a material layer of the substrate. The global area may be selected from the group consisting of a square, a rectangle, and a circle. The patterning process to form an expected pattern may comprise an etching process having a global etching loading bias. The patterning process data may comprise parameters associated with a process tool to implement the etching process. The patterning process data may comprise parameters associated with a process tool to implement the etching process; a recipe of the etching process, and/or composition of a material layer of the substrate in which the expected pattern is to be formed. The correcting may comprise evaluating the global etching loading bias versus pattern density according to the manufacturing data. The correcting may comprise adjusting dimensions of the selected pattern feature to compensate the global etching loading bias. The method may further comprise repeating the selecting, defining, calculating, and correcting steps until other pattern features in the photomask layout are corrected. The selected pattern feature may comprise a plurality of sub-features within an area. The method may further comprise determining a correlation length of the global etching loading bias based on the manufacturing data. The defining a global area may comprise defining the global area substantially centered at the selected pattern feature and substantially including other pattern features within the correlation length. The calculating a pattern density may comprise weighted averaging of a local pattern density within the global area.

The present disclosure also provides a method of forming a mask compensating for a global etching loading bias of an etching process to pattern the mask. The method comprise forming a mask layout from an expected pattern; determining a correlation length associated with the global etching loading bias; defining a global area substantially centered at a selected pattern feature on the mask layout, wherein a distance from the selected pattern feature to perimeter of the global area is about the correlation length; calculating a pattern density in the global area; correcting the selected pattern feature to compensate the global etching loading bias; and repeating the defining, calculating, and correcting steps until a plurality of pattern features in the mask layout are corrected. The pattern density may be a ratio between a weighted sum of areas of the plurality of pattern features in the global area and an area of the global area. The method may further comprise forming a tape-out after each of the plurality of pattern features in the mask layout are corrected; and fabricating the mask using the tape-out.

The present disclosure also provides a method of fabricating a mask having critical dimension (CD) correction based on a global pattern loading effect. The method comprises generating a first layout according to an IC pattern to be formed on a semiconductor substrate, forming a second layout by adjusting the first layout based on a global pattern loading bias, and forming a tape-out based on the second layout. The forming a second layout comprises defining a global area based on an etching process to form the IC pattern on the mask wherein the etching process has a global etching loading bias, calculating a pattern density inside the global area, finding the global etching loading bias based on the global pattern density and the etching process, and adjusting dimensions of a pattern feature in the global area to compensate the global etching loading bias. The method may further comprise forming the mask using the tape-out and the etching process.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method for forming a mask layout, comprising:
   selecting a pattern feature on the mask layout;
   defining a global area centered at the pattern feature on the mask layout;
   calculating a pattern density inside the global area; and
   correcting the pattern feature based on the calculated pattern density and patterning process data.

2. The method of claim 1 further comprising forming an expected pattern on a substrate selected from a group consisting of a photomask, a semiconductor wafer, and a transparent glass plate.

3. The method of claim 2, wherein the forming an expected pattern comprises forming a pattern of integrated circuit in a material layer of the substrate.

4. The method of claim 1, wherein the defining a global area comprises defining a global area having a shape selected from a group consisting of a square, a rectangle, and a circle.

5. The method of claim 1 further comprising forming an expected pattern using an etching process.

6. The method of claim 5, wherein the correcting the pattern feature comprises correcting in response to parameters associated with a process tool to implement the etching process.

7. The method of claim 5, wherein the correcting the pattern feature comprises correcting in response to a recipe of the etching process.

8. The method of claim 5, wherein the correcting the pattern feature comprises correcting in response to composition of a material layer of the substrate in which the expected pattern is to be formed.

9. The method of claim 5, wherein the correcting pattern feature comprises evaluating a global etching loading bias versus pattern density according to the patterning process data.

10. The method of claim 5, wherein the correcting the pattern feature comprises adjusting dimensions of the pattern feature to compensate a global etching loading bias.

11. The method of claim 1 further comprising repeating the selecting, defining, calculating, and correcting steps until other pattern features in the photomask layout are corrected.

12. The method of claim 1, wherein the selecting a pattern feature comprises selecting a pattern feature having a plurality of sub-features within an area.

13. The method of claim 1 further comprising determining a correlation length of the global etching loading bias based on the patterning process data.

14. The method of claim 13, wherein the defining a global area comprises defining a global area substantially centered at the pattern feature and substantially including other pattern features within the correlation length.

15. The method of claim 14, wherein the calculating a pattern density comprises weighted averaging of a local pattern density within the global area.

16. A method for forming a mask compensating for a global etching loading bias of an etching process to pattern the mask, comprising:
    forming a mask layout from an expected pattern;
    determining a correlation length associated with the global etching loading bias;
    defining a global area substantially centered at a selected pattern feature on the mask layout, wherein a distance from the selected pattern feature to perimeter of the global area is about the correlation length;
    calculating a pattern density in the global area;
    correcting the selected pattern feature to compensate the global etching loading bias; and
    repeating the defining, calculating, and correcting steps until a plurality of pattern features in the mask layout are corrected.

17. The method of claim 16, wherein the pattern density is a ratio between a weighted sum of areas of the plurality of pattern features in the global area and an area of the global area.

18. The method of claim 16 further comprising:
    forming a tape-out after each of the plurality of pattern features in the mask layout are corrected; and
    fabricating the mask using the tape-out.

19. A method for fabricating a mask having critical dimension (CD) correction based on a global pattern loading effect, comprising:
    generating a first layout according to an IC pattern to be formed on a semiconductor substrate;
    forming a second layout by adjusting the first layout based on a global pattern loading bias, comprising:
        defining a global area based on an etching process to form the IC pattern on the mask wherein the etching process has a global etching loading bias;
        calculating a global pattern density inside the global area;
        finding the global etching loading bias based on the calculated global pattern density and the etching process; and
        adjusting dimensions of a pattern feature in the global area to compensate the global etching loading bias; and
    forming a tape-out based on the second layout.

20. The method of claim 19 further comprising forming the mask using the tape-out and the etching process.

* * * * *